(12) United States Patent
Khalily et al.

(10) Patent No.: US 8,271,256 B2
(45) Date of Patent: Sep. 18, 2012

(54) PHYSICS-BASED MOSFET MODEL FOR VARIATIONAL MODELING

(75) Inventors: Ebrahim Khalily, Los Altos, CA (US); Aaron J. Barker, Broomfield, CO (US); Alexandru N. Ardelea, Austin, TX (US)

(73) Assignee: Oracle America, Inc., Redwood City, CA (US)

( * ) Notice: Subject to any disclaimer, the term of this patent is extended or adjusted under 35 U.S.C. 154(b) by 538 days.

(21) Appl. No.: 12/540,890

(22) Filed: Aug. 13, 2009

(65) Prior Publication Data
US 2011/0040548 A1   Feb. 17, 2011

(51) Int. Cl.
*G06F 17/50* (2006.01)
(52) U.S. Cl. .......................................... 703/14; 716/132
(58) Field of Classification Search .................... 703/13, 703/14; 716/101, 106, 11, 136, 111, 132
See application file for complete search history.

(56) References Cited

U.S. PATENT DOCUMENTS

| | | | |
|---|---|---|---|
| 2005/0132306 A1* | 6/2005 | Smith et al. | 716/1 |
| 2006/0225009 A1* | 10/2006 | Reddy et al. | 716/4 |
| 2010/0169846 A1* | 7/2010 | Gupta et al. | 716/2 |

* cited by examiner

*Primary Examiner* — Dwin M Craig
*Assistant Examiner* — Andre Pierre Louis
(74) *Attorney, Agent, or Firm* — Osha • Liang LLP

(57) ABSTRACT

A method of optimizing MOSFET device production which includes defining key independent parameters, formulating those key independent parameters into a canonical variational form, calculating theoretical extracted parameters using at least one of key independent parameters in canonical variational form, physics-based analytical models, or corner models. The method also includes calculating simulated characteristics of a device using the key independent parameters and extracting target data parameters based on at least one of measured data and predicted data, comparing the simulated characteristics to the target data parameters, and modifying the theoretical extracted parameters or key independent parameters in canonical form as a result of the comparison. Then, calculating and outputting the simulated characteristics based on the modified theoretical extracted parameters and the modified key independent parameters in canonical form.

18 Claims, 3 Drawing Sheets

PHYSICS-BASED MOSFET MODEL FOR VARIATIONAL MODELING

BACKGROUND OF INVENTION

1. Field of the Disclosure

Embodiments described herein generally relate to a physics-based approach to model and optimize metal-oxide-semiconductor field-effect transistor (MOSFET) devices.

2. Background Art

As process technology continues to reduce dimensions, process variation becomes a major source of yield loss. Circuit simulation and timing analysis tools are needed to correctly account for process variations in order to avoid the inherent pessimism of the traditional methodologies and timing analyses. Statistical timing analysis tools have been recently developed to provide more accurate and powerful timing analysis of digital circuits.

Inherent equipment and environment fluctuations in the semiconductor fabrication process create a variation in device and circuit performance. While every effort is made in the fabrication process, and also in the design process, to reduce the magnitude and the impact of these variations, some level of variation can not be avoided and may become a limiting factor in the performance of the technology.

Traditional approaches of modeling variations have been through the definition of "corner models." These corner models are usually defined in terms of the ranges for drive currents or threshold voltages. For example, fast-fast and slow-slow corners refer to process points where both p-channel and n-channel devices are at their maximum (or minimum) saturation drive current ("Id-sat") conditions. In traditional circuit designs, the design may be simulated at the corners and checked for functionality and the conforming to specified characteristics. Similar approaches may be used in static timing analysis. The timing boundaries may be checked at specific process or environmental points. Traditional corner methodologies may also assume that all parameters vary independently over a specified range.

In reality, however, most parameters are correlated and dependent. Due to this limitation, the traditional corner methodologies may not accurately reflect the impact of the variations and may be inherently too pessimistic or too optimistic, depending on the circuit characteristics of interest and the metrics on which the corners exemplify.

SUMMARY OF INVENTION

In one aspect, one or more embodiments of the present invention relate to a method of optimizing MOSFET device and circuit production including: the definition of key independent parameters, formulating those key independent parameters into a canonical variational form, calculating theoretical extracted parameters using at least one of key independent parameters in canonical variational form, physics-based analytical models, or corner models. The method also includes extracting parameters based on at least one of measured data and predicted data, comparing the theoretical extracted parameters to the extracted parameters, and modifying the theoretical extracted parameters or key independent parameters in canonical form as a result of the comparison. Then calculating and outputting the simulated characteristics based on the modified theoretical extracted parameters and the modified key independent parameters in canonical form.

In one aspect, one or more embodiments of the present invention relate to a computer readable medium comprising software instructions to optimize MOSFET device production, wherein the software instructions include functionality to: calculate theoretical extracted parameters using at least one of key independent parameters in canonical variational form, physics-based analytical models, or corner models. The instructions also include calculating simulated characteristics of a device using at least one of key independent parameters in canonical form or theoretical extracted parameters using a variational model. Further, the instruction include extracting parameters based on at least one of measured data and predicted data, comparing the theoretical extracted parameters to the measured extracted parameters, and modifying the theoretical extracted parameters or the key independent parameters in canonical form as a result of the comparison to the extracted parameters. Then calculating and outputting the simulated characteristics based on the modified theoretical extracted parameters and the modified key independent parameters in canonical form.

Other aspects and advantages of the invention will be apparent from the following description and the appended claims.

DETAILED DESCRIPTION

Figure 1:
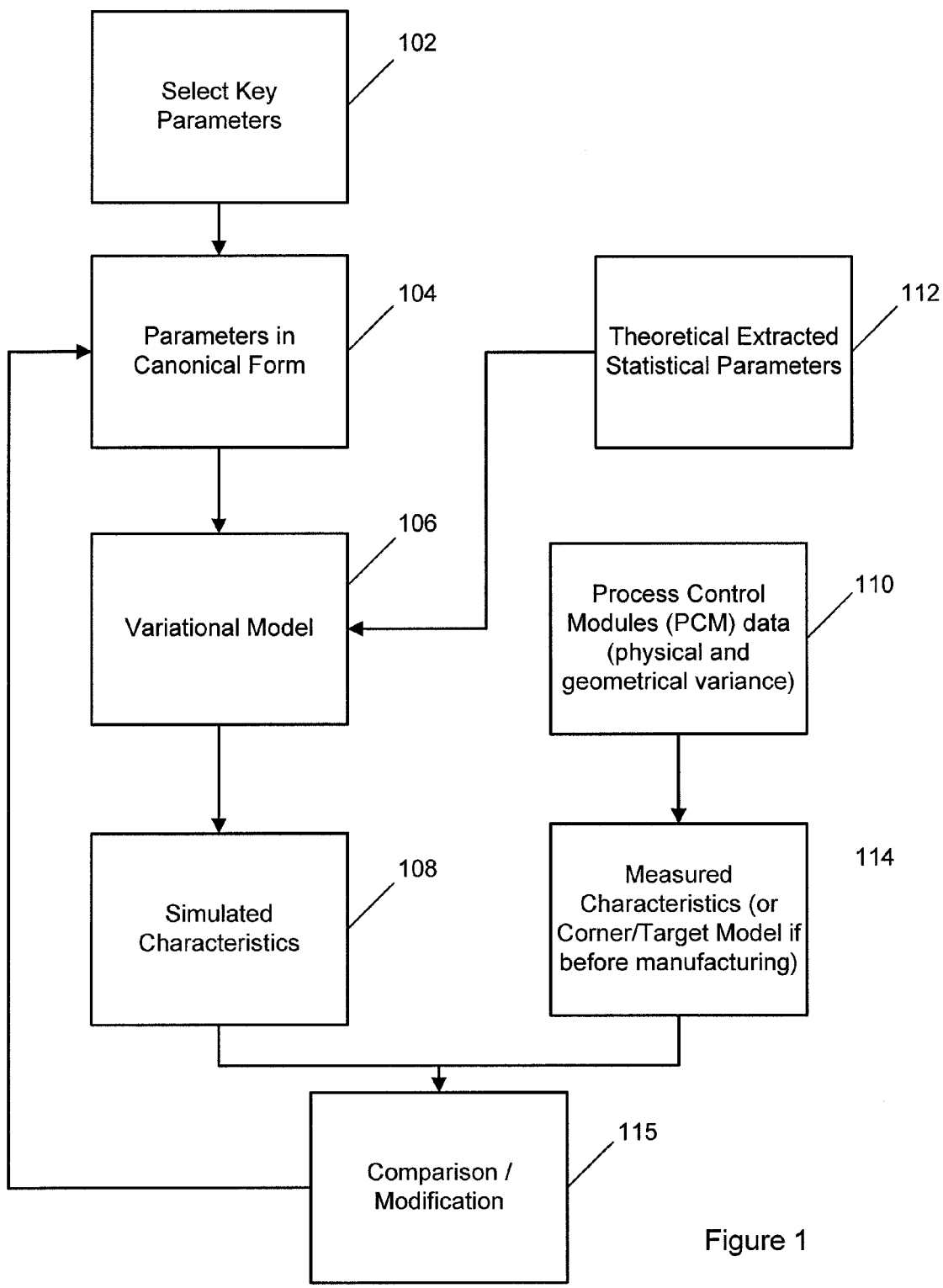
FIG. 1 shows a flowchart in accordance with one or more embodiments of the invention.

Specific embodiments of the present disclosure will now be described in detail with reference to the accompanying Figures. Like elements in the various figures may be denoted by like reference numerals for consistency. Further, in the following detailed description of embodiments of the present disclosure, numerous specific details are set forth in order to provide a more thorough understanding of the invention. However, it will be apparent to one of ordinary skill in the art that the embodiments disclosed herein may be practiced without these specific details. In other instances, well-known features have not been described in detail to avoid unnecessarily complicating the description.

In MOSFET production, as one monitors Lot after Lot, Wafer after Wafer, Die after Die, and Device after Device, a certain natural division becomes apparent. This division allows the system to be broken up into regional domains. In the present application, the first domain is referred to as the Global Variation, often called the Chip Mean (CM). The CM represents the variation for the average chip and how that average will drift from Lot to Lot, Wafer to Wafer, and Die to Die. Another domain is referred to as the Local Variation, often called the MisMatch (MM) domain. The MM represents the fluctuation between two identically designed devices sitting side-by-side. The third variation is referred to as Across Chip (AC). The AC variation is used to define gradient effects not classifiable as CM or MM. In the production process, each of these variations may be systematic or random.

In the present application, global variations are assumed to vary uniformly across all the transistors in a circuit during a manufacturing process. For example, this includes variations across the chip, wafer, lot, and multiple-lots. These variations include process variations which consist of inter-Die, Die-to-Die, Wafer to Wafer, and lot to lot variations. The dominant effects typically come from variable critical dimensions (poly CD), channel doping, or flatband voltage variations. The environmental variations, such as ambient temperature, power supply voltage, or channel hot carrier and negative bias temperature instability, typically impact all circuits on the chip. These variations are included in the present application as global variations.

Gradient variations are independent, correlated variations in temperature, supply voltage, and across-chip process parameters such as poly CD. These variations may contribute to variations in behavior of the circuit or group of circuits relative to the same circuit in a different location on the chip.

In one aspect, embodiments disclosed herein generally relate to a physics-based model for process variations in MOSFET device production. The model utilizes governing physics model equations to incorporate process variations using critical independent process parameters. A powerful statistical simulation environment has been created to utilize the physics-based model and enable full analysis of the global and mismatch variations on semiconductor circuits. This approach may also be extended to define variational timing models for delay and transit times of logic gates and cells. The variational timing models may provide statistical timing analysis of high performance digital designs. The embodiments described herein may also provide tools to create a powerful platform for statistical analysis of high performance circuits and enable design of more robust, higher performance systems. A robust, complete analytical system for the statistical analysis of high performance circuits may provide the information necessary to modify, improve, or create production techniques.

A statistical device model may be designed for use in conjunction with any known MOSFET models, for example, BSIM (Berkley Short-channel IGFET Model), or any other Compact Model Council approved model. For example, the statistical device model may be defined as a super-set of the BSIM4 MOSFET model. The model defines Monte Carlo seeds for a set of key physical and process parameters 102. The BSIM4 model parameters may then be calculated based on these key process variants. Then the BSIM4 model may also be called to calculate the devices currents and capacitances needed for circuit simulation.

Referring to FIG. 1, in one embodiment, the device behavior may be assumed to be impacted by a set key independent process variants or parameters 102. For example, the following set of these key parameters may be selected: the flatband voltage (VFB), for both n-type and p-type devices, the channel doping concentration at depletion edge for zero body bias (NDEP) for n-type and p-type devices, the electrical oxide thickness (TOXE), the zero biased lightly doped drain (LDD) resistance per unit width (RSDW) for n-type and p-type devices, the channel length offset correction due to mask/etch effects (DXL), the channel width offset correction due to mask/etch effects (DXW).

These key independent parameters then may be cast into a canonical variational form 104, such as:

$VFB = VFB_{mean} + VFB_{stdv} * VFB_{sigma}$ $NDEP = NDEP_{mean} + NDEP_{stdv} * NDEP_{sigma}$ $TOXE = TOXE_{mean} + TOXE_{stdv} * TOXE_{sigma}$ $RDSW = RDSW_{mean} + RDSW_{stdv} * RDSW_{sigma}$ $DXL = DXL_{mean} + DXL_{stdv} * DXL_{sigma}$ $DXW = DXW_{mean} + DXW_{stdv} * DXW_{sigma}$ In the above equations, the following conventions are adopted: $PAR_{mean}$ represents the PAR parameter extracted at nominal, or target device, PARstdv is the factor specifying the magnitude of the PAR variation relative to a sigma skew on device characteristics. $PAR_{stdv}$ may be determined from measured data during the model extraction process. $PAR_{sigma}$ represents a Monte Carlo seed with a Gaussian distribution with standard deviation of one.

The formulation above may be used to model 106 the range of variation of these parameters. A known model, such as BSIM4, may then model the impact of these parameters on device characteristics 108.

Those skilled in the art will appreciate the above representation of a canonical variational form is not limited to the embodiment described above. For example, $PAR_{mean}$ could be determined as a standard mean, or $PAR_{sigma}$ could be represented by any number of standard distribution functions, such as Gaussian, Log-normal, Weibull, etc.

Typically, the known MOSFET device models, such as the BSIM4 model, consist of a hierarchy of parameters and analytical sub-models covering several layers of abstraction, the lowest layer being an intrinsically process-based abstraction, and the highest layer providing more control and ease of extraction for modeling secondary effects. These secondary effects may include mobility reduction, non-uniform doping, short channel effects, velocity saturation, etc. Most parameter extraction tools use the higher level parameter set and associated analytical sub-models in order to fit the measured data more easily.

In the present application, the physics-based statistical model uses the equations of the known variational model 106, for example BSIM4, to connect the higher and lower parameter sets described above. In this way the variational model 106 may use the physics-based BSIM equations, for example, while a nominal model is extracted in terms of the higher level parameter set.

In one embodiment, the physics-based statistical model may use the analytical form of the threshold voltage definition and parameters 112 such as the long channel threshold voltage at zero body bias and the first and second order body bias coefficients to define the nominal and possibly other corner models. The variational part of the long channel threshold voltage may be then expressed using the physics-based definitions for surface potential and other parameters, such as the surface ($\gamma_1$) and bulk ($\gamma_2$) body effect coefficients. These other parameters may then be calculated from NDEP, TOXE, and other independent parameters.

As a result, this model may then use a combination of common extraction tools 112 and methodology for the nominal parameters together with the physics-based model equations for the variational part 106. This allows for the model to exhibit correct physical correlations and dependencies between all parameters and characteristics for different size devices 108.

More precisely, in one or more embodiments, the variational model 106 may select the following extracted parameters 112 of the nominal model: the first (K1) and second (K2) order body bias coefficients, the long channel threshold at zero body bias (VTH0), the gate-drain overlap capacitance (CGDO), the gate-source overlap capacitances (CGSO), and the fringing field capacitance (CF). The variational model 106 may then use the exact BSIM4 equations, or other known model equations. These equations construct the parameters 112, as if the parameters were not extracted, from lower level process parameters and physical constants. Examples of the lower level process parameters and physical constants are stated as follows:

$$K1 = \gamma_2 - 2K2\sqrt{\Phi_S - VBM}$$

$$K2 = \frac{(\gamma_1 - \gamma_2)(\sqrt{\Phi_S - VBX} - \sqrt{\Phi_S})}{2\sqrt{\Phi_S}(\sqrt{\Phi_S - VBX} - \sqrt{\Phi_S}) + VBM}$$

$$VTH0 = VFB + \Phi_S + K1\sqrt{\Phi_S}$$

$$CGDO = C_{OXE}DLC - cgdl$$

$$CGSO = C_{OXE}DLC - cgsl$$

$$CF = \frac{2\varepsilon_{ox}}{\pi}\ln\left(1 + \frac{cst}{TOXE}\right)$$

The equations for the intermediate parameters appearing in the right hand side of the previous equations, such as $\gamma_1$, $\gamma_2$, the surface potential ($\Phi_s$), the equation defining VBX as the body bias when the depletion width is equal to XT (doping depth) may follow known model definitions, for example, the BSIM4 definitions:

$$C_{oxe} = \frac{\varepsilon_{ox}}{TOXE}$$

$$\gamma_1 = \frac{\sqrt{2q\varepsilon_{SI}NDEP}}{C_{oxe}}$$

$$\gamma_2 = \frac{\sqrt{2q\varepsilon_{SI}NSUB}}{C_{oxe}}$$

$$\Phi_S = 0.4 + phin + \frac{k_BT}{q}\ln\left(\frac{NDEP}{n_i}\right)$$

$$\frac{qNDEPXT^2}{2\varepsilon_{SI}} = \Phi_S - VBX$$

The previous equations allow this construction process to be pushed down to a level where the dependencies are expressed in terms only of basic process parameters, for example, TOXE, NDEP, NSUB, etc. and also physical constants, for example $k_b$, $q$, $\epsilon_{ox}$, etc.

The statistical model then may formulate each parameter from the selected {K1, K2, . . . CF} set as a variational expression consisting of a mean term which is taken from the nominal model and a variational term which may be determined as the formal difference between an analytical definition of that parameter with and without process variations. For example, the $1^{st}$ order body coefficient may be expressed as:

$$K1 = K1_{mean} + \Delta K1(NDEP_{mean}, NDEP_{stdv}, TOXE_{mean}, TOXE_{stdv}, \ldots)$$

where in the previous equation, $$\Delta K1 = K1(NDEP_{mean}, NDEP_{stdv}, TOXE_{mean}, TOXE_{stdv}, \ldots) - K1(NDEP_{mean}, 0, TOXE_{mean}, 0, \ldots)$$

The variational term $\Delta K1$ then may be a longer expression containing the correct functional dependencies, for example as per BSIM4 governing equations, on the low level process parameter variations:

$$\Delta K1 = -((\text{Sqrt}(NSUB)*sqSi*TOXE\text{mean})/\epsilon_{ox}) + (\text{Sqrt}(NSUB)*sqSi*(TOXEstdv*TOXE\text{sigma}+TOXE\text{mean}))/\epsilon_{ox} + (2*(\text{Sqrt}(NDEP\text{mean})-\text{Sqrt}(NSUB))*sqSi*TOXE\text{mean}*\text{Sqrt}(0.4+phin-VBM+kbTq*\text{Log}(NDEP\text{mean}/ni))*(\text{Sqrt}(NDEP\text{mean}*qovSi*pwr(XT,2))-\text{Sqrt}(0.4+phin+kbTq*\text{Log}(NDEP\text{mean}/ni))))/(\epsilon_{ox}*(-0.8-2.*phin+VBM-2*kbTq*\text{Log}(NDEP\text{mean}/ni)+2.*\text{Sqrt}((0.4+phin+kbTq*\text{Log}(NDEP\text{mean}/ni))*(0.4+phin-1.*VBM+kbTq*\text{Log}(NDEP\text{mean}/ni))))) - (2*(\text{Sqrt}(NDEPstdv*NDEP\text{sigma}+NDEP\text{mean})-\text{Sqrt}(NSUB))*sqSi*(TOXEstdv*TOXE\text{sigma}+TOXE\text{mean})*\text{Sqrt}(0.4+phin-VBM+kbTq*\text{Log}((NDEPstdv*NDEP\text{sigma}+NDEP\text{mean})/ni))*(\text{Sqrt}(0.+(NDEPstdv*NDEP\text{sigma}+NDEP\text{mean})*qovSi*pwr(XT,2))-\text{Sqrt}(0.4+phin+bTq*\text{Log}((NDEPstdv*NDEP\text{sigma}+NDEP\text{mean})/ni))))/(\epsilon_{ox}*(-0.8-2*phin+VBM-2.*kbTq*\text{Log}((NDEPstdv*NDEP\text{sigma}+NDEP\text{mean})/ni)+2.*\text{Sqrt}((0.4+phin+bTq*\text{Log}((NDEPstdv*NDEP\text{sigma}+NDEP\text{mean})/ni))*(0.4+phin-VBM+kbTq*\text{Log}((NDEPstdv*NDEP\text{sigma}+NDEP\text{mean})/ni)))))$$

By comparison to the previous expression, the variational term for the fringing capacitance may be considerably shorter, as it may only depend on the mean and variational components of a single parameter, for example the oxide thickness. In the BSIM4 example, the variational term may be expressed as follows:

$$\Delta CF = (-2*\epsilon_{ox}*\text{Log}((cst+TOXE\text{mean})/TOXE\text{mean}))/\pi + (2*\epsilon_{ox}*\text{Log}(1+cst/(TOXEstdv*TOXE\text{sigma}+TOXE\text{mean})))/\pi$$

The previous examples have been chosen to illustrate the functional variety of the variational expressions with regard to specific key process parameters (TOXE in K1 vs. TOXE in CF) as well as the complex interactions between some key process parameters (TOXE and NDEP in K1).

The DXL and DXW offset variation parameters may be considered in the system through the equations for the effective channel length and width:

$$L_{eff} = L + XL + DXL - 2\left(DLC + \frac{LLC}{L^{LLN}} + \frac{LWC}{W^{LWN}} + \frac{LWLC}{L^{LLN}W^{LWN}}\right)$$

$$W_{eff} = \frac{W}{NF} + XW + DXW - 2\left(DWC + \frac{WLC}{L^{WLN}} + \frac{WWC}{W^{WWN}} + \frac{WWLC}{L^{WLN}W^{WWN}}\right)$$

The break down of variability into the global (CM), local (MM) and gradient (AC) regions discussed previously may be reflected in the choice of the variational expressions of the key process parameters. For example, using the BSIM4 model with DXL chosen as an example:

$$DXL = DXL_{mean} + DXL_{stdvCM}*DXL_{sigmaCM} + DXL_{stdvMM}*DXL_{sigmaMM} + DXL_{stdvAC}*DXL_{sigmaAC}$$

This choice may lead to a generalization for higher the level parameters. Again, using the BSIM4 model and K1 as an example:

$$K1 = K1_{mean} + dK1\begin{pmatrix} NDEP_{mean}, NDEP_{stdvCM}, \\ NDEP_{stdvMM}, NDEP_{stdvAC}, \\ TOXE_{mean}, TOXE_{stdvCM}, \\ TOXE_{stdvMM}, TOXE_{stdvAC}, \ldots \end{pmatrix} - K1\begin{pmatrix} NDEP_{mean}, \\ 0, 0, 0, \\ TOXE_{mean}, \\ 0, 0, 0, \ldots \end{pmatrix}$$

In one or more embodiments, the physics-based model may be used with a standard binned model. The binned model has been known to add non-physical behaviors and interact with the physical variations of L and W. The binning algorithm has also been known to add discontinuities in the intermediate parameters over bin boundaries. However, the physics-based model is still capable of operating in the binned model. As some of the parameters are scaled based on channel length and width, this creates a challenge because length and width may also be changed by the variational model. This issue is resolved by adding appropriate multiplier factors to all equations that use L (length) and W (width).

The binning equations have the following general form:

$$par = \frac{lpar}{L_{eff}} + \frac{wpar}{W_{eff}} + \frac{ppar}{L_{eff} * W_{eff}}$$

For clarity, the previous equations may be rewritten for effective lengths and widths, with the understanding that variations are accounted through the DXL and DXW terms.

$$L_{eff} = L + XL + DXL - 2*LINT - 2*geom_L$$

$$W_{eff} \frac{w}{NF} + XW + DXW - 2*WINT - 2*geom_W$$

where $geom_L$ and $geom_W$ represent additional geometry scaling of L and W as explained in previous section.

Because the extraction 112 of binning is done prior to applying the variational model, it may be necessary to adjust the bin boundaries to ensure that the device remains within the same bin as prior to applying the DXL and DXW variations. This may be accomplished by the following substitutions:

$$l_{min} = l_{min} + DXL$$

$$l_{max} = l_{max} + DXL$$

$$w_{min} = w_{min} + DXW$$

$$w_{max} = w_{max} + DXW$$

If the $DXL_{stdv}$, $DXW_{stdv}$ factors are large, then new bin boundaries can differ significantly from initial boundaries. Thus, the domain over which the bin-composition equation was determined may be altered with the risk compromising the validity of the bin-composition mechanism.

Also, because the binned parameters were defined prior to varying L and W, the binned parameters may need to be adjusted accordingly. One solution may be to scale the binning factors {lpar, wpar, ppar} for each binnable parameter 'par':

$$lpar = lpar \frac{L + XL + DXL - 2*LINT - 2*geom_L}{L + XL - 2*LINT - 2*geom_L}$$

$$wpar = wpar \frac{w/NF + XW + DXW - 2*WINT - 2*geom_W}{W/NF + XW - 2*WINT - 2*geom_W}$$

$$ppar = ppar \left( \frac{L + XL + DXL - 2*LINT - 2*geom_L}{L + XL - 2*LINT - 2*geom_L} \right)$$

$$\left( \frac{W/NF + XW + DXW - 2*WINT - 2*geom_W}{W/NF + XW - 2*WINT - 2*geom_W} \right)$$

The physics-based statistical model is not limited to the binning model. One skilled in the art would appreciate that the physics-based model may be used with other models, such as a continuous model without bins.

In one or more embodiments, a methodology has been defined to extract statistical model parameters from Process Control Modules (PCM) data 110, as measured on silicon, and possibly expected process variation, defined as target corners. For mature technologies, measured Id-sat, Id-off and Vt on various size test structures and from multiple processing lots may be used as the input for extraction 114. For predictive models, the target corners are used to define the expected range of distributions 114. The typical, worst and best target corners may be used. For evolving technologies a combination of measured data and target corners 114 may be used.

It is desirable that the measured data represents the expected distribution of a target process. For evolving technologies, if the process has not been stable, a shift of the nominal point 115 may be needed. In this case, the key objective of the extraction is to define the model factors such that the standard deviations of the simulated Id and Vt match 115 the measured data.

In one or more embodiments, a series of steps may be used in the extraction methodology to define the variation factors on the most dominant device size. In the following steps, the objective is to match the simulated distributions to the desired distributions. For simplicity, the ±3 sigma variations of device characteristics may be assumed to be matched. In one or more embodiments, a more complete approach may be used that considers the desired specifications, such as USL, LSL, or Target and the process capability, such as Cp and Cpk.

$TOXE_{stdv}$ may define the impact of the oxide thickness variation on device behavior. $TOXE_{stdv}$ may be adjusted to match ±3 sigma variation of the measured TOXE or Cgox. TOXE may also impact the overall variation in Id and Vt and may need to be adjusted based on the current and threshold voltage variations. $VFB_{stdv}$ and $NDEP_{stdv}$ may define the impacts of flat-band voltage, which may be primarily determined by the ion implantation dose in the channel, and the doping density at the edge of the channel-substrate on the device characteristics. These parameters may be adjusted for both n and p channel devices using measured data for a large device, for example, a one micron width over a one micron length. These parameters may also be adjusted to match ±3 sigma of distribution of simulated Vt & Id to measured Vt & Id.

$DXW_{stdv}$ may define the impact of the channel width variation on device behavior. This factor may be most dominant on a narrow width device. This factor may be adjusted by matching the ±3 sigma of simulated Id variation on n and p type narrow devices to measured Id distributions.

$DXL_{stdv}$ may define the impact of channel length variation on device behavior. This variation may be most dominant on a short channel device with a wide width. This factor may be adjusted by matching the ±3 sigma of simulated Id for both n and p channel devices with short channel length to measured Id.

The $RDSW_{stdv}$ factors may define the impacts of the source-drain series resistance variations on the n and p type device characteristics. These factors are considered most dominant on a minimum geometry device with short and narrow channel. These factors may be adjusted by matching the ±3 sigma of the simulated Id for the n and p channels to the measured data for a small device.

The outline above may define and extract the values for the above factors to provide an overall fit to all size devices. As the target corners may be, and usually are, predictive, i.e., not necessarily defined based on real silicon, one skilled in the art will appreciate that some compromises may be necessary to find an overall fit on all sizes.

As previously described, the physics-based model may support local and across chip variational components for every key process parameter. However, only the process parameters that are expected to have a significant local variation may be extracted.

In one or more embodiments, specific key parameters may be extracted to match the range of variations in threshold voltage and drive currents of N and P type devices. Specifically, for example, the mismatch deviation of the flatband voltage, VFBstdv, for N and P type devices and the mismatch deviation of the channel length and width offset correction, $DXL_{stdv}$ and $DXW_{stdv}$, respectively, may be extracted to match the range of variations in the threshold voltage and drive currents of the N and P type devices. The previous parameters may be first adjusted assuming the standard deviation of the global variation for each of the key parameters is set to zero. The parameters may be adjusted to match a measured local variation. Once the local variation factors are defined, the global factors may then be adjusted to match the total variation.

The extraction of the local variations may proceed similar to the extraction of the global variations. The flatband voltage parameters, VFB, may be adjusted for a large device. Then, a channel length offset correction component, DXL, may be extracted on the short channel device. Similarly, a channel width offset correction component, DXW, may be extracted on the narrow width device.

In one or more embodiments, the variational analysis may be useful to identify the impact variation has upon electrical circuits using Statistical Monte Carlo simulations. Such embodiments may rectify numerous short comings found in alternate implementations and commercially available simulators, such as improper assumptions.

This variational analysis, as described in FIG. 1, may provide an understanding of the range of impact process, voltage, temperature and other variations, such as noise and signal, have upon the behavior of particular circuits. It may also predict the number of instances which will effectively yield, as well as identify and mitigate, the various components of sensitivity. Because the model is based on physics and the individual parameters actually reflect physical characteristics found in the production facility's ("FAB's") process control, the FAB may be informed as to process adjustments based on various circuit and timing level considerations. This may provide the FAB with the best process node for the Microprocessor architectural goals.

In one or more embodiments, a powerful environment for statistical circuit simulation is described to implement a statistical system into the models of a Simulation Program with Integrated Circuit Emphasis (SPICE) simulator. The SPICE simulator may then perturb the variables as desired. As is well known in the art, several commercial SPICE tools provide various proprietary features and syntax which may aid in this kind of model implementation, and possibly improve the runtime performance. The more universally accepted syntax of nesting model cards within a .subckt may be used. This approach is generally accepted among different SPICE model simulators. This approach may also add the ability of adding spice elements and additional model cards for the elements to the .subckt. This may enable the modeling of additional extrinsic characteristics, such as contact resistance, metallurgical junctions, or other parasitic elements. This approach may also enable the modeling of intrinsic characteristics that a given SPICE model may not support, for example BSIM4; however the intrinsic characteristics may be emulated by adding a reverse biased diode or even a behavioral device supported in commercial SPICE tools.

Figure 2:
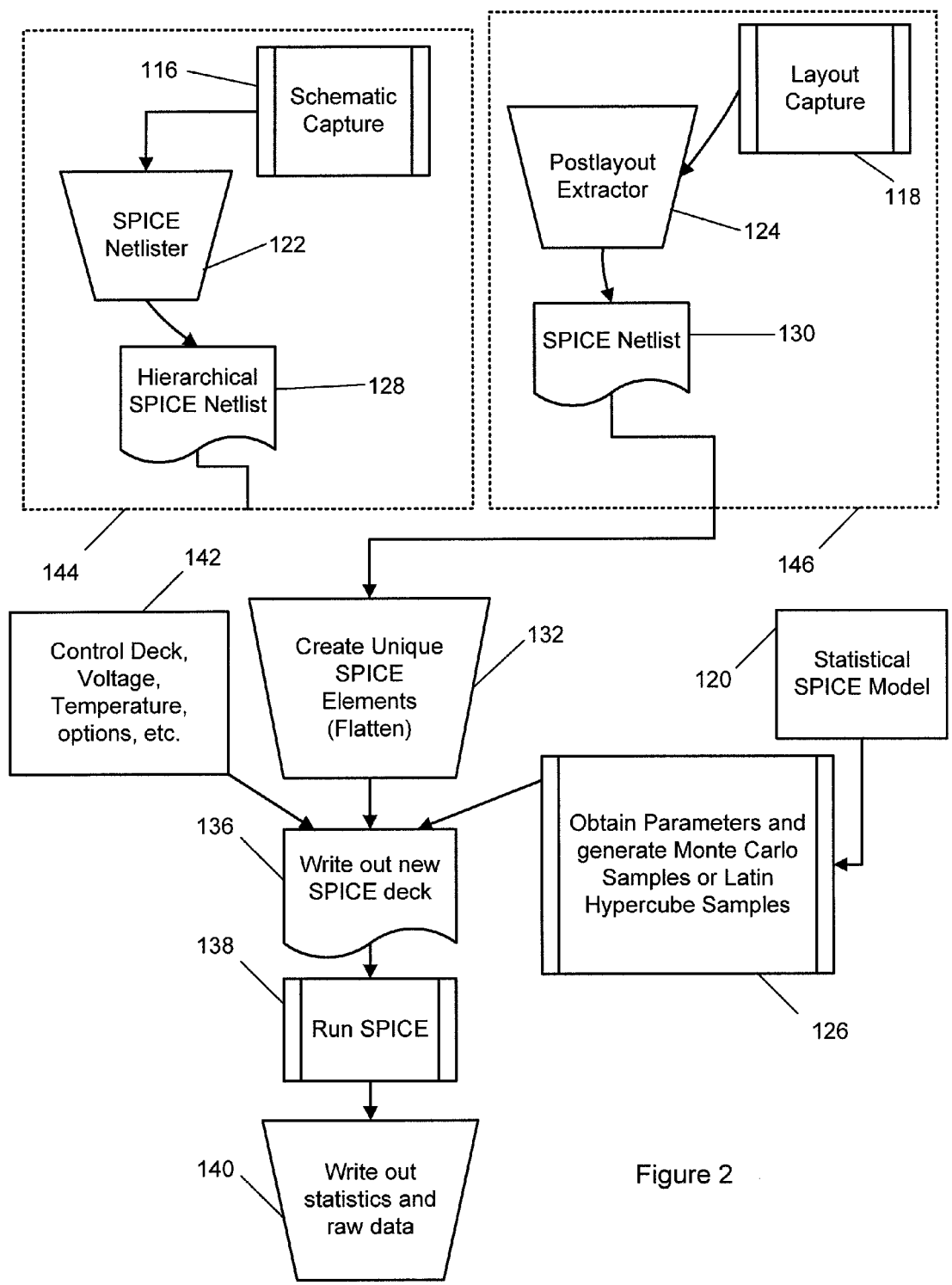
FIG. 2 shows a flowchart in accordance with one or more embodiments of the invention.

In one or more embodiments, a deterministic simulation may be set in the form of SPICE netlist and SPICE-deck, the objectives of the statistical analysis is specified, and the flow may automatically access the physics-based model and perform required conversions transparent to the user. Referring to FIG. 2, the design may be defined in a usual manner.

The first step 144, defines a hierarchical SPICE netlist 128 from a SPICE netlister 122 based on a schematic capture 116. The second step 146, defines a SPICE netlist 130 from a post-layout extractor 124, based on a layout capture 118. In order to properly handle global and local variations of the device parameters, the circuit netlists 128 and 130 may be first flattened down to the transistor level 132. The parameters 120 of each device may be then perturbed from a final fabrication process and as defined in the physics-based statistical model 126. The statistical simulation 136 is performed by repeating SPICE simulation 138 for various seeds, which represent variations in the process. Appropriate Monte Carlo and Latin Hypercube Sampling (LHS) distribution of the seeds may be utilized in calculating the perturbation of the device parameters to provide a required distribution for each application. At the end of the simulations, the results may be summarized and stored 140 in proper formats to enable future analysis using standard statistical analysis tools. The analysis may then be used to fine tune the statistical analysis, or modify the parameters in the production process.

In one or more embodiments, .subckt based models may be used to model inheritance of custom defined parameters. This may allow the creation of unique instance parameters and pass their values onto the model card, where the statistical governing equations may reside. Such embodiments are advantageous as natively SPICE .model cards may not otherwise support such custom parameters.

One limitation which is often prevalent in commercial SPICE tools is the random number generator (RNG). Often the RNG produces "Gaussian" data which may exhibit unnatural hard cutoffs in the data at ±3 sigma. This may create an undesired "edge effect" in the response, as opposed to a natural Gaussian distribution which exhibits scarcity of data relative to the number of samples.

Another limitation of the commercial SPICE tools is that the RNG often exhibits unnatural or non-random clumping and a high degree of covariance between parameters. A high degree of covariance may be therefore introduced in the output, which may bias the results.

In addition, there may be over $2^N$ process corners, where N is the number of main effects (or degrees of freedom) of the statistical system. A systematic check of the corners or utilizing random runs, such as what found in commercial SPICE tools Monte Carlo implementations, may not be feasible.

In one or more embodiments, the limitations of sampling methods of commercial SPICE tools may be overcome by using LHS. The use of LHS may directly addresses the limitations of the sampling methods of commercial SPICE tools. LHS may keep the data well stratified, and extend the data into the tails of the distributions. This may enforce a quasi-zero covariance. With commercial SPICE tools, the data may be clumped and the covariance between samples may be too high to be considered independent. This false covariance may be wrongly imposed upon the system and may lead to incorrect conclusions about the output data.

LHS may also create an Nth dimensional Equal Probability Grid for various factors. Then, a robust RNG, i.e., Super-Duper RNG, may choose a value of the various hyperplanes with which the data point may be associated. That data point may then be eliminated from future candidacy if another future data point occupies one of the intersecting planes.

Another advantage of LHS may be a stratified sampling that qualifies as random. With LHS, the sample size grows linearly per dimension and may perform with 5-10 times the number of main effects. In traditional Monte Carlo, in order to encapsulate the Nth dimensional space the sample size must grow exponentially per dimension. Monte Carlo is known to support known distributions and correlations in samples; however, it may be preferable to handle this inside the model. It is well know in the art that it is better practice to use independent seeds, and then create covariance with equations which relate the independent Gaussian samples.

When using LHS or other sampling methods, it may be advantageous to select the syntax such that the first sample in the sample text file describes the process target or mean of the system. This sample point may be critical for the verification of target alignment. It may also be critical in obtaining a good fit if the data is converted into equivalent response surface models or surrogate mathematical systems of equations. It may be advantageous to convert into surrogate mathematical systems of equations for use in Statistical Static Timing Analysis (SSTA) and the like.

Often times, in pre-layout, the instance parameters will be used to represent the number of folds. This assumption requires the accounting for individual transistor fingers interaction. It must, therefore, average out the mismatch variational effects. In one or more embodiments, the deviation of the Local or MisMatch variation may be multiplied by the square root of a multiplier as a crude approximation of this effect. Primarily this is used to illustrate how mechanics may be imbedded into the model. Typically, in post layout this is not a concern because each finger is extracted out as its own unique device.

In one or more embodiments, a key aspect of statistical modeling may be the definition and demarcation of the domains of variation for the statistical simulation. The modeling of Chip Mean (CM) variation may be fairly straight forward, as all devices in the analysis may have the same set of parameters with the same level of sigma skew applied to each individual parameter.

MisMatch (MM) may be more difficult as each device, or element, may need its own set of parameters to be uniquely skewed. This motivates the creating unique instances per device and generating unique sample for these parameters. One way to create unique SPICE element instances may be by flattening the .subckt instances down to the device level. In this situation, the cost of MisMatch parameters should be taken into account. Each defined local parameter may have to be declared uniquely for each device in the simulation, which may explode sample set size.

Across Chip (AC) may be the most challenging, as it may require some insight into the floor plan of the chip to determine the specification Across Chip domains.

Once the domains for CM, AC, and MM have been defined, the associated statistical parameters may be perturbed. In one or more embodiments, the equations may be formulated such as the stochastic variables are expressed in terms of Gaussian distributions with a mean of zero and a standard deviation of one.

Because the Monte Carlo convergence rate behaves as: $1/\sqrt{n_{sample}}$, where $n_{sample}$ is the number samples, the input should be specified for 1,000-10,000 or more samples depending on the criticality of the circuit, confidence level, confidence interval that is desired, and the amount of computation resources which may be allocated to the task. These types of Monte Carlo simulations are easily threadable and may be split across numerous computational resources.

In one or more embodiments, uniform or log uniform distributions may be used to seed the statistical parameters for the design of experiments, optimization, sensitivity analysis, and model building. This will push the samples to the edges of the process capability that is desirable. In an extreme analysis, the uniform distributions may be set to span ±4.5 sigma, or even ±6 sigma and beyond, depending how critical the circuit and the level of overdesign that is desired to be incorporated into the margins.

The uniform distribution of seeds in this embodiment is appropriate for applications where it is desirable to get an understanding of the circuit behavior over an entire range; for example, a sensitivity analysis, where the circuit sensitivity to each process or environment variants is analyzed.

It should be noted, in one or more embodiments, if components are not perturbed, but rather, are set to a worse case corner or set to perfectly match the targeted values, then there is no way to know whether or not these factors should be of any concern.

In one or more embodiments, the proper distributions may be taken from the process control to perform a yield analysis. Typically, this implies a Gaussian distribution, as the stochastic system is structured to expect independent Gaussian distributions upon the statistical parameters and then perform an internal transform if it becomes necessary to express another kind of distribution or covariance amongst effects.

The data and files of the embodiments described above may be outputted in a space delimited table including the seeds and measurement results for use in additional analysis tools, e.g., SAS, Jmp, MATLAB, R-Project, etc. Typically, the output is organized by first the seeds, and then an alphabetical list of the results. These results may then be used to modify manufacturing characteristics to optimize production based on the comparison of the theoretical extracted parameters from the physics-based variational SPICE models and the extracted parameters, as described above.

The natural division of the CM, AC, and MM variation domains may be verified by creating a test chip with multiple arrays or clusters of Process Control Monitoring (PCM) structures. PCM structures should be identical to one another and laid out in such a manner as to keep the individual devices in as close proximity to one another as possible. The array or cluster may then be duplicated at strategic locations on the die.

The magnitude of variation may be obtained by polling data metrics from each of the individual PCM structures in the array or cluster and calculating the resulting mean and standard deviation. The standard deviation represents the magnitude of the local intra-die variation. The mean, which may shift from cluster location to cluster location on the die, indicates across chip gradients. The standard deviation may be derived from polling the mean values of all the cluster locations on a single die. The standard deviation may then represent the magnitude of the across chip intra-die variation. Gathering the mean values from all the devices in all of the arrays or clusters may give the mean for that specific chip (chip mean). The mean values may be calculated for multiple dies on the wafer as well as from wafer to wafer and lot to lot. Calculating the standard deviation from these Chip Mean values may provide the magnitude necessary to define the global inter-die variation. It may be necessary to repeat the calculation for the local variation for each of the arrays or clusters to account for the variation in the variance and obtain the absolute magnitude for local variation.

In another embodiment, a more compact method of polling data from a more limited number of PCM structures may be employed. By polling the difference in value from two pair combinations, operations may be performed with fewer samples. For example, with only one instantiation of the PCM structure, there may be no insight into intra-die variation. With two instantiations of the PCM structure there may be only one data point. However, a 9×9 array may give 9!/(2!*(9−2)!)=3240 misMatch samples. In practice, it may be advantageous to use even larger arrays of PCM test structures. From the test structures, an average delta may be derived, and a standard deviation of the magnitude of the difference between two identical devices may also be expressed. The transformation from pair wise mismatch variation to local variation may be related by the square root of two. In other words, $$\text{StdDev}_{MM} = 2(\text{StdDev}_{local})$$

Similarly, this method of evaluating pair wise combinations may be applied to the derivation of Across Chip and Chip Mean quantities.

Under certain circumstances, it may be noticed that the magnitude of variation exhibited by MM and AC is dependant on where the Chip Mean of the process resides. In other words, the magnitude of local intra-die variation may not necessarily be independent of the global process shifts. There may exist a correlated relationship between the tolerances of the factors which govern the global inter-die variation and the factors which govern the local intra-die variation. If such a relationship is observed, it should be ensured that the model exhibits a similar relationship between the factors which govern the global inter-die variation and the factors which govern the local intra-die variation. In this case, the factors should not be treated as independent uncorrelated phenomena.

The PCM elements in the array may be traversed spatially, and the extracted values analyzed to observe whether or not trend fluctuations are random in occurrence and relative magnitudes. Also, a trend along the axis of traversal may be observed. It may be possible to observe alternate trends which may contrast to the previously observed data. For example, as the array is traversed an increase or decrease in the magnitude of fluctuation may be observed. Similarly, a tendency for the values to have a global trend, apart from the noise, may be observed. Based upon the number of test structures and the relative number of trend inversions, a certain confidence level that the trend is random may be obtained. This data may then be used in defining and/or verifying the magnitude of MM.

When the polling of data is complete, and provided the testing is non-destructive, it may be advantageous to completely re-initiate and resample the first set of test structures and tests. This may determine the amount of tolerance in the probing equipment. The tests and probes may also be run multiple times on multiple testers. If the devices during the tests exhibit aging or degradation during testing, it is advantageous to go back to the initial tester and repeat the tests to quantify how the aging may have biased the data. It is advantageous to mitigate the tolerances and variations of test equipment and potential aging from the raw data to not bias any findings.

A similar analysis may be done for multiple sets of PCM structures and metrics, various device sizes, and various layout strategies. Ideally, the device dimensions used in verification are a superset, if not and entirely different set, to the dimensions used as input to specify and formulate the model. This is advantageous in order to ensure that even under interpolation, extrapolation, and high orders of degrees of interaction the statistical model still holds.

One or more embodiments of the present disclose may be used to model the statistical timing of circuits. Analogous to the embodiments described in FIG. 2, statistical timing may be used to determine the earliest and the latest signal arrival times at each node. It is preferable that the signal propagation bounds fit within a specified target cycle time. One such embodiment may choose two process corners, fastest and slowest transistors, to calculate the signal bounds. The selection of the fastest and slowest transistors insures all possible combinations of process and environment are considered. As the signals are propagated, it is preferable to check the signal bounds are calculated to cover the full range. In this embodiment, it is understood that the signal bounds may become more and more pessimistic as the signals are propagated.

In a statistical timing analysis, signals are defined and propagated as distributions of the arriving signals. Any delays and output slews may also be calculated as distributions. Delays may be expressed as functions of the load and the input slews, but may also be functions of the process variations as described previously in FIG. 1.

The gate and interconnect level signal propagation may inherit the accuracy of the deterministic analysis and may provide accurate estimation of the impact of process variation on the signals. This embodiment may not only accurately model the mean and deviation, but also accurately estimate the signal sensitivity to any process parameter. Once the timing signals are propagated, the probability of timing failures at each node may be calculated. Then, a user may define confidence levels at which the slacks may be calculated.

In one or more embodiments, the dependencies and correlations of the signals and delays in the circuit may be fully preserved. The preservation may be accomplished by maintaining the statistical information at a higher level of abstraction. The delays and output slews may be defined as response surface models of the same key independent parameters used in a circuit simulation level, described previously. This approach may provide a close link between the timing delay models and the technology by using the physics-based statistical model.

In one or more embodiments, the statistical models for combinational and sequential cells may be defined using a statistical characterization tool. During the statistical characterization, delay arcs may be simulated at random process points for each load and input slew condition, using the physics-based statistical model as described with regards to FIG. 1. A response surface model may then be generated to describe the variation of delays due to global process parameters. Similarly, a response surface model may also be used to describe deviations due to the local variation. The previously mentioned response surface model polynomials and the nominal delay, expressed in a form of a deterministic delay, may represent the statistical timing model.

Accuracy of the characterization may be verified by comparing a response surface modeled delay to a simulated SPICE delay. For example, comparing the modeled delay to the simulated delay has shown better than 5% accuracy in delay and output slew. Also, similar levels of accuracies have been observed in modeling local variations.

A key advantage of statistical timing may be providing much accurate analysis of the circuit timing and the impact of process variations on the timing. More accuracy allows for the removal or reduction of pessimistic process, voltage, and temperature margins that are often added to a deterministic timing analysis. A circuit designer may then use this information to improve performance, and avoid fixing unnecessary critical paths. This may also reduce the time to market.

Figure 3:
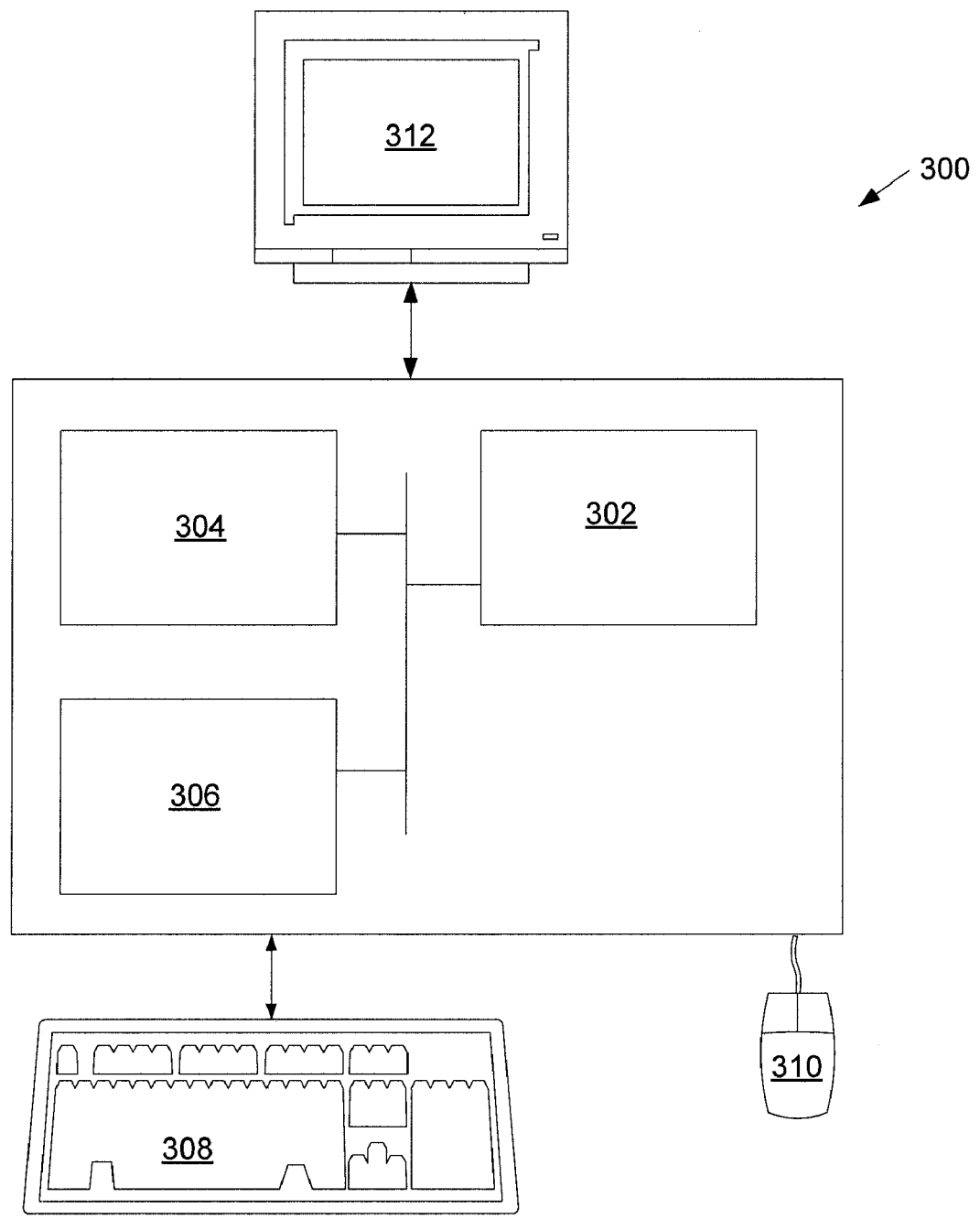
FIG. 3 shows a computer system in accordance with one or more embodiments of the invention.

One or more embodiments may be implemented on virtually any type of computer regardless of the platform being used. For example, as shown in FIG. 3, a networked computer system 300 includes a processor 302, associated memory 304, a storage device 306, and numerous other elements and functionalities typical of today's computers (not shown). The networked computer 300 may also include input means, such as a keyboard 308 and a mouse 310, and output means, such as a monitor 312. The networked computer system 300 is connected to a local area network (LAN) or a wide area network via a network interface connection (not shown). Those skilled in the art will appreciate that these input and output means may take other forms. Further, those skilled in the art will appreciate that one or more elements of the aforementioned computer 300 may be remotely located and connected to the other elements over a network. Further, software instructions to perform embodiments of the invention may be stored on a computer readable medium such as a compact disc (CD), a diskette, a tape, or any other physical computer readable storage device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of optimizing MOSFET device production comprising:
    defining, using a computer, key independent parameters;
    formulating key independent parameters into a canonical variational form, wherein the canonical variational form comprises a key independent parameter extracted at nominal, or target, device specifications plus a product of magnitude of a variation of the key independent parameter, relative to a skew of a distribution on device characteristics, and a selected distribution;
    calculating theoretical extracted parameters using at least one of key independent parameters in canonical variational form, physics-based analytical models, and corner models;
    calculating simulated characteristics of a device using at least one of key independent parameters in canonical form or theoretical extracted parameters using a variational model;
    extracting target data parameters based on at least one of measured data and predicted data;
    comparing the simulated characteristics to the target data parameters;
    modifying the theoretical extracted parameters based on the comparison to the target data parameters;
    modifying the key independent parameters in canonical form based on the modified theoretical extracted parameters;
    calculating and outputting the simulated characteristics based on the modified theoretical extracted parameters and the modified key independent parameters in canonical form; and
    modifying the key independent parameters in the device production using the simulated characteristics.

2. The method of claim 1, wherein key independent parameters comprise at least one of:
    a flatband voltage, for both n-type and p-type devices;
    a channel doping concentration at depletion edge of zero body bias, for both n-type and p-type devices;
    an electrical oxide thickness;
    a zero biased lightly doped drain resistance per unit width, for both n-type and p-type devices;
    a channel length offset correction due to production techniques; and
    a channel width offset production due to production techniques.

3. The method of claim 1, wherein the variational model uses system parameters comprising BSIM4 physical model parameters.

4. The method of claim 1, wherein the method of extracting the theoretical statistical parameters based on the target data parameters comprises at least one of:
    identifying and measuring data parameters and distribution of data parameters in process control monitoring;
    extracting statistical model parameters from measured data parameters; and
    determining a distribution of model parameters from the measured data parameters and the distribution of the measured data parameters.

5. The method of claim 4 wherein the statistical model parameters comprise at least one of:
    an electrical oxide thickness;
    a standard deviation of the electrical oxide thickness;
    a flatband voltage, for both n-type and p-type devices;
    a standard deviation of the flatband voltage, for both n-type and p-type devices;
    a channel doping concentration at depletion edge of zero body bias, for both n-type and p-type devices;
    a standard deviation of the channel doping concentration at depletion edge of zero body bias, for both n-type and p-type devices;
    a zero biased lightly doped drain resistance per unit width, for both n-type and p-type devices; and
    a standard deviation of the zero biased lightly doped drain resistance per unit width, for both n-type and p-type devices.

6. The method of claim 4, wherein the distribution of measured data parameters in process control monitoring comprises at least one of global variations, local variations, gradient variations, or combinations thereof.

7. The method of claim 1, wherein the variational model is implemented on BSIM4.

8. The method of claim 1, further comprising:
    defining and nesting statistical model cards;
    adding SPICE elements to a .subckt to model extrinsic characteristics;
    implementing multiple spice simulations for different seed parameters based on the theoretical extracted parameters;
    flattening a circuit netlist to transistor level;
    perturbing at least one of the key independent parameters and the theoretical extracted parameters;
    storing results in an accessible format;
    comparing results to manufactured circuits; and
    modifying at least one of manufacturing characteristics, key independent parameters, or theoretical extracted parameters based on the comparison.

9. The method of claim 1, further comprising:
    defining earliest and latest arrival times;
    defining delays and output slews based on the key independent parameters and the theoretical extracted parameters;
    using a statistical characterization tool to simulate delay arcs at random process points;
    generating a response surface model to describe deviations in global and local variations;
    storing results in an accessible format;
    identifying and correcting circuits violating statistical requirements.

10. The method of claim 1, wherein process control monitors are defined, and global inter-die, gradient intra-die, and local intra-die variations are extracted in the domains of chip mean, across chip, and mismatch.

11. A non-transitory computer readable medium comprising software instructions to optimize MOSFET device production, wherein the software instructions comprise instructions for causing a computer to perform:

calculating theoretical extracted parameters using at least one of key independent parameters in canonical variational form, physics-based analytical models, and corner models;

calculating simulated characteristics of a device using at least one of key independent parameters in canonical form or theoretical extracted parameters using a variational model;

extracting target data parameters based on at least one of measured data and predicted data;

comparing the simulated characteristics to the target data parameters;

modifying the theoretical extracted parameters based on the comparison to the target data parameters;

modifying the key independent parameters in canonical form based on the modified theoretical extracted parameters;

calculating and outputting the simulated characteristics based on the modified theoretical extracted parameters and the modified key independent parameters in canonical form; and modifying the key independent parameters in the device production using the simulated characteristics, wherein the canonical variational form comprises a key independent parameter extracted at nominal, or target, device specifications plus a product of magnitude of a variation of the key independent parameter, relative to a skew of a distribution on device characteristics, and a selected distribution.

12. The computer readable medium of claim 11, wherein key independent parameters comprise at least one of:
a flatband voltage, for both n-type and p-type devices;
a channel doping concentration at depletion edge of zero body bias, for both n-type and p-type devices;
an electrical oxide thickness;
a zero biased lightly doped drain resistance per unit width, for both n-type and p-type devices;
a channel length offset correction due to production techniques; and a channel width offset production due to production techniques.

13. The computer readable medium of claim 11, wherein the variational model uses parameters comprising BSIM4 physical model parameters.

14. The computer readable medium of claim 11, wherein the method of extracting the theoretical statistical parameters based on the target data parameters comprises at least one of:
identifying and measuring data parameters and distribution of data parameters in process control monitoring;
extracting statistical model parameters from measured data parameters; and
determining a distribution of model parameters from the measured data parameters and distribution of the measured data parameters.

15. The computer readable medium of claim 14 wherein the statistical model parameters comprise at least one of:
an electrical oxide thickness;
a standard deviation of the electrical oxide thickness;
a flatband voltage, for both n-type and p-type devices;
a standard deviation of the flatband voltage, for both n-type and p-type devices;
a channel doping concentration at depletion edge of zero body bias, for both n-type and p-type devices;
a standard deviation of the channel doping concentration at depletion edge of zero body bias, for both n-type and p-type devices;
a zero biased lightly doped drain resistance per unit width, for both n-type and p-type devices; and
a standard deviation of the zero biased lightly doped drain resistance per unit width, for both n-type and p-type devices.

16. The computer readable medium of claim 14, wherein the distribution of measured data parameters in process control monitoring comprises at least one of global variations, local variations, gradient variations, or combinations thereof.

17. The computer readable medium of claim 11, further comprising:
defining and nesting statistical model cards;
adding SPICE elements to a .subckt to model extrinsic characteristics;
implementing multiple spice simulations for different seed parameters based on the theoretical extracted parameters;
flattening a circuit netlist to transistor level;
perturbing at least one of the key independent parameters and the theoretical extracted parameters;
storing results in an accessible format;
comparing results to manufactured circuits; and
modifying at least one of manufacturing characteristics, key independent parameters, or theoretical extracted parameters based on the comparison.

18. The computer readable medium of claim 11, further comprising:
defining earliest and latest arrival times;
defining delays and output slews based on the key independent parameters and the theoretical extracted parameters;
using a statistical characterization tool to simulate delay arcs at random process points;
generating a response surface model to describe deviations in local variations;
storing results in an accessible format; and
identifying and correcting circuits violating statistical requirements.

* * * * *